United States Patent [19]
Hamaguchi et al.

[11] Patent Number: 5,381,315
[45] Date of Patent: Jan. 10, 1995

[54] SHELF ASSEMBLY IN ELECTRONIC SWITCHING SYSTEM

[75] Inventors: Akihiro Hamaguchi; Hisao Osone; Hirotoshi Takada, all of Kawasaki; Jun Ohta, Fukuoka, all of Japan

[73] Assignee: Fujitsu Limited, Kawasaki, Japan

[21] Appl. No.: 115,770

[22] Filed: Sep. 3, 1993

[30] Foreign Application Priority Data

Mar. 9, 1993 [JP] Japan ................. 5-047772

[51] Int. Cl.⁶ ............................................. H05K 7/20
[52] U.S. Cl. .................... 361/727; 312/333; 361/692; 361/801; 379/428
[58] Field of Search .................... 211/41; 70/85; 200/50 AA, 51 R; 379/428, 440; 165/80.3; 312/201, 215, 236, 257.1, 264, 265.3, 308, 333; 361/689, 690, 692, 715, 716, 724–727, 756, 759, 796, 801, 802, 803, 826–829, 831, 608, 609

[56] References Cited

U.S. PATENT DOCUMENTS

| | | | |
|---|---|---|---|
| 3,689,128 | 9/1972 | Andreini | 312/320 |
| 4,321,654 | 12/1982 | Nakajo | 361/396 |
| 4,702,535 | 10/1987 | Beun | 312/308 |
| 4,975,804 | 12/1990 | Dehnert | 361/391 |
| 5,170,894 | 12/1992 | Joist | 211/41 |

*Primary Examiner*—Gerald P. Tolin
*Attorney, Agent, or Firm*—Staas & Halsey

[57] ABSTRACT

A shelf assembly in an electronic switching system in which storability of a cable and coolability of the assembly are enhanced. The shelf assembly comprises an upper stationary rail firmly secured to an upper member of the shelf, an upper slide rail slidably mounted on the upper stationary rail, a lower stationary rail firmly secured to a bottom member of the shelf, and a slide rail slidably mounted on the lower stationary rail. The shelf assembly further comprises a cable box firmly secured to the upper and lower slide rails, the cable box having a plate spreading vertically, an area for receiving the cable being defined in one side surface of the vertical plate; and a drawer unit removably inserted in the cable box along the other side surface of the vertical plate, the drawer unit having a plurality of per-line packages which are withdrawably inserted in the drawer unit, the per-line packages each storing the contents of service per subscriber. A common unit is withdrawably inserted in the shelf, and a cable for electrically connecting the common unit to the drawer unit extends so far as to a front end of the vertical plate of the cable box along the one side surface of the vertical plate.

5 Claims, 9 Drawing Sheets

SHELF ASSEMBLY IN ELECTRONIC SWITCHING SYSTEM

BACKGROUND OF THE INVENTION

1. Field of the Invention

This invention relates generally to a shelf assembly in an electronic switching system, and particularly to a storage structure for storing cables in a shelf assembly.

2. Description of the Related Art

With the progress of higher density of electronic switching systems in recent years, easiness and rapidness of maintenance/services are demanded with respect to subscriber's lines. In order to meet with this demand, there is a tendency to individualize the subscriber's lines (i.e., "per-line") in which each subscriber's line is stored in a single package so that only that particular package may be removed for repair in case of a failure or fault in order not to affect the remaining subscriber's lines.

With the progress of the "per-line" of the subscriber's lines, there is proposed a shelf assembly in which a plurality of drawer units having a plurality of "per-line" packages each storing the contents of service per subscriber removably mounted therein, are withdrawably placed on the shelf. Further placed on the shelf is a common unit which is to be interfaced with other systems. The common unit and the drawer unit are connected to each other through a plurality of cables. However, this involves the problems that as the result of "per-line" of the packages, the amount of cable required is increased, cable formability is deteriorated in assembling factories, and a cooling of the system is interrupted by the cables which altogether serve as an interruption wall.

Heretofore, there is employed a construction in which the cables coming out of the common unit are connected respectively to the backs of the drawer units. According to this cable connection structure, the cables are formed at an assembling factory such that each cable is in a generally fully stretched condition when each drawer unit has been withdrawn fully. When each drawer unit is inserted in the shelf, each cable is stored in the shelf in its bending condition but with a part of the cable slightly projecting from the back of the shelf. The switching system comprises a plurality of such shelf assemblies placed on a rack.

However, in the conventional storage structure having the cables stored in the shelf, since the cables connected to the backs of the drawer units are left free without being supported by anything within the shelf, there is a possibility that the cables are accidentally caught by the shelf when the drawer units are pushed into the shelf. Also, there is a possibility that the cables accidentally enter into the insertion area of the adjacent drawer unit to contact the package, etc. inserted in the drawer unit, and move together with them. As a result, a rapture, etc. are likely to occur to the outer jackets of the cables thereby adversely affecting the durability and reliability of the switching system.

Since the cables partly project from the back of the shelf, it becomes impossible to carry out a maintenance from the back in the event the switching system comprises the shelf assemblies which are placed in back-to-back relation on the racks. This means that a lot of processes are required when the cables have been subject to failure.

In the case where the shelf assemblies are placed in back-to-back relation, a ventilation path is provided between the back-to-back shelf assemblies. However, since the cables partly project from the backs of the shelves, heat generated from heating components located below becomes impossible to ascend in a satisfactory manner, thus resulting in significant reduction of cooling capacity of the switching system.

Furthermore, since a gap or space between the adjacent drawer units is small in the conventional shelf assembly, the heat of the packages inserted in the drawer units tends to flow into the adjacent drawer unit before its temperature is satisfactorily lowered. This can again cause the cooling capacity of the switching system to be lowered.

SUMMARY OF THE INVENTION

It is therefore an object of the present invention to provide a shelf assembly in an electronic switching system in which storability of a cable in the assembly and coolability of the assembly are enhanced.

In accordance with an aspect of the present invention, there is provided a shelf assembly in an electronic switching system, comprising a shelf including a pair of side walls, an upper member for connecting the side walls together, and a lower member likewise connecting the side walls together; an upper stationary rail firmly secured to the upper member; an upper slide rail slidably mounted on the upper stationary rail; a lower stationary rail firmly secured to said lower member; a lower slide rail slidably mounted on the lower stationary rail; a cable box firmly secured to the upper and lower slide rails, the cable box having a plate spreading vertically, an area for receiving a cable being defined in one side surface of the vertical plate; a drawer unit removably inserted in the cable box along the other side surface of the vertical plate, the drawer unit having a plurality of per-line packages which are withdrawably inserted in the drawer unit and which each stores the contents of service per subscriber; a common unit withdrawably inserted in the shelf; a cable for electrically connecting the common unit to the drawer unit, the cable extending so far as to a front end of the vertical plate of the cable box along the one side surface of the vertical plate; and a connector for connecting one end of the cable to a front end portion of the drawer unit.

Preferably, the shelf assembly further comprises a duct which is mounted on a front end upper portion of the shelf, the duct allowing the cable to pass therethrough; and lock means for locking the upper slide rail relative to the upper stationary rail when the upper slide rail is in a fully pushed-in position and also in a fully pulled-out position.

According to the present invention, since the cable is stored in the cable box along the side surface of each cable box, the cable of a length corresponding to a moving amount of each drawer unit can be completely stored in the shelf. Furthermore, twisting, etc. of the cable conventionally occurred at the time when the cable is stored, is greatly reduced, and the cable can be stored in the shelf in an orderly manner by utilizing the principle that an extra length portion of the cable is bent at the time when the cable is stored.

Moreover, since the drawer units are inserted in the cable box, an air pool defined by the cable box occurs between the adjacent drawer units when the drawer units are in inserted position into the shelf, thereby enhancing the cooling capacity. Furthermore, in the case where the switching system comprises the shelf assemblies placed in back-to-back relation on the rack, a sufficient ventilation area can be obtained because the cables do not partly project from the backs of the shelves. As a result, coolability is enhanced.

The above and other objects, features and advantages of the present invention and the manner of realizing them will become more apparent, and the invention itself will best be understood from a study of the following description and appended claims with reference to the attached drawings showing some preferred embodiments of the invention.

DESCRIPTION OF THE PREFERRED EMBODIMENTS

Figure 1:
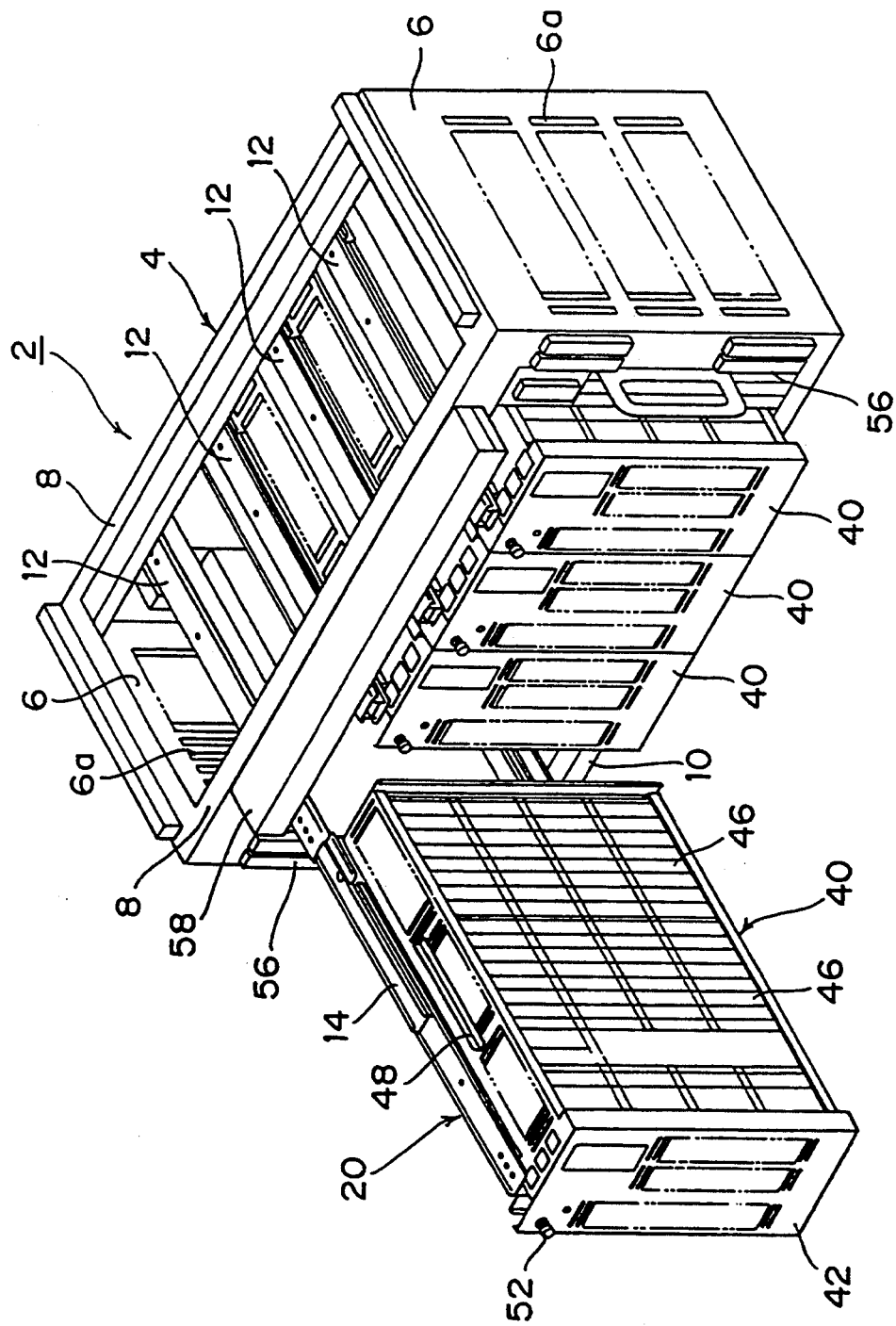
FIG. 1 is a perspective view of one embodiment of the present invention in which a drawer unit is in fully withdrawn position.
Figure 2:
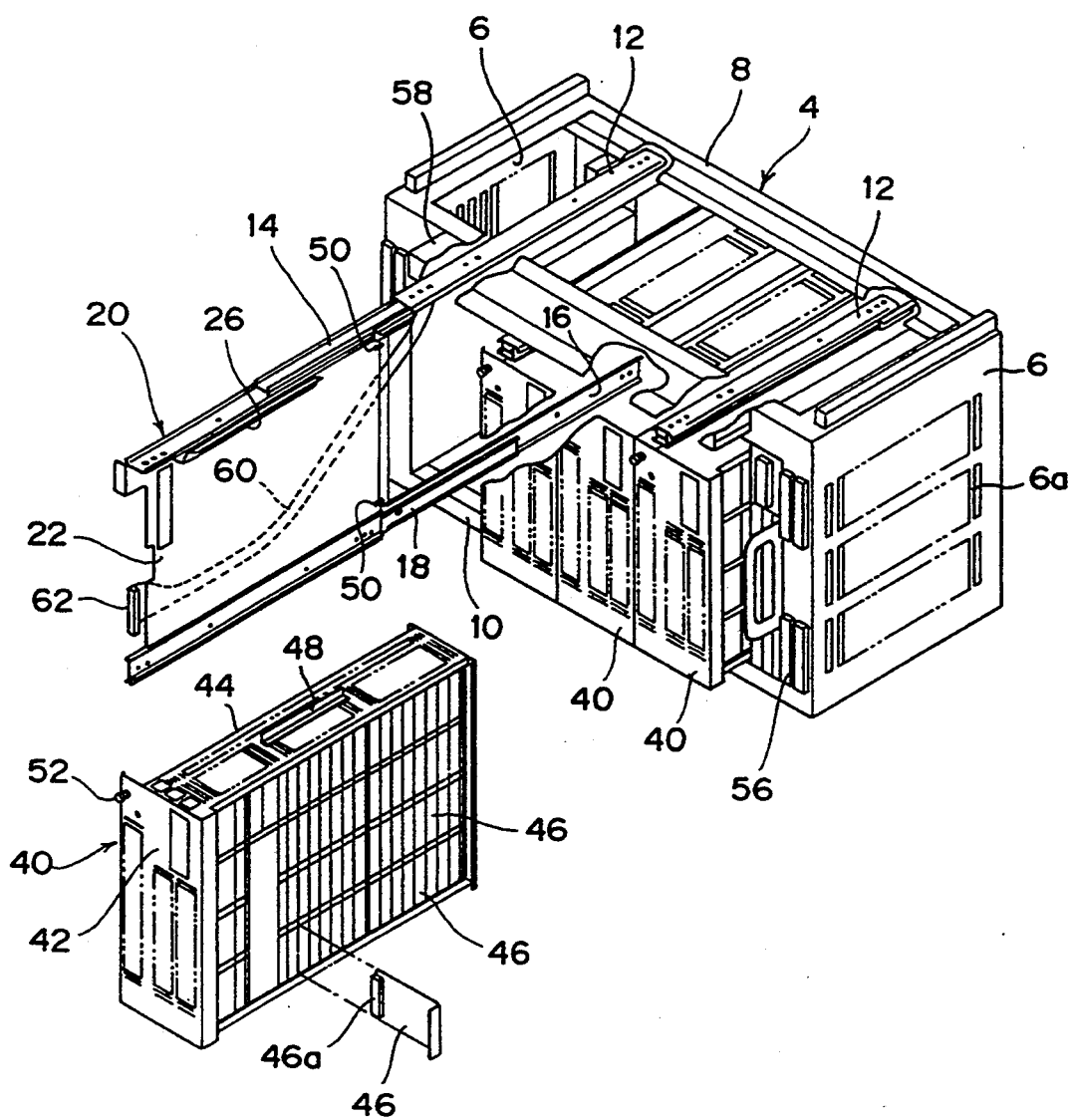
FIG. 2 is likewise a perspective view of the embodiment of the present invention but in which the drawer unit is in removed position.

Referring first to FIGS. 1 and 2, there are shown, respectively, perspective views of a shelf assembly 2 according to one embodiment of the present invention in which a drawer unit is in fully withdrawn position and also in removed condition. A shelf 4 comprises a pair of side plates 6, a pair of upper cross beams 8 connecting the side plates 6 together, and a pair of lower cross beams 10 likewise connecting side plates 6 together. A plurality of ventilation holes 6a are formed in each side plate 6.

A plurality of upper stationary rails 12 (four stationary rails in this embodiment) are mounted on lower surfaces of the upper cross beams 8 in such a manner as to be spaced apart from each other. An upper slide rail 14 is slidably mounted on each upper stationary rail 12. Similarly, a plurality of lower stationary rails 16 are mounted on upper surfaces of the lower cross beams 10 in such a manner as to be spaced apart from each other, and a lower slide rail 18 is slidably mounted on each lower stationary rail 16. As best shown in FIG. 2, the upper stationary rails 12 are mounted on the upper cross beams 8 in their horizontal postures, but the lower stationary rails 16 are mounted on the lower cross beams 10 such that guide surfaces of the lower stationary rails 16 are perpendicular to the lower cross beams 10.

Figure 6:
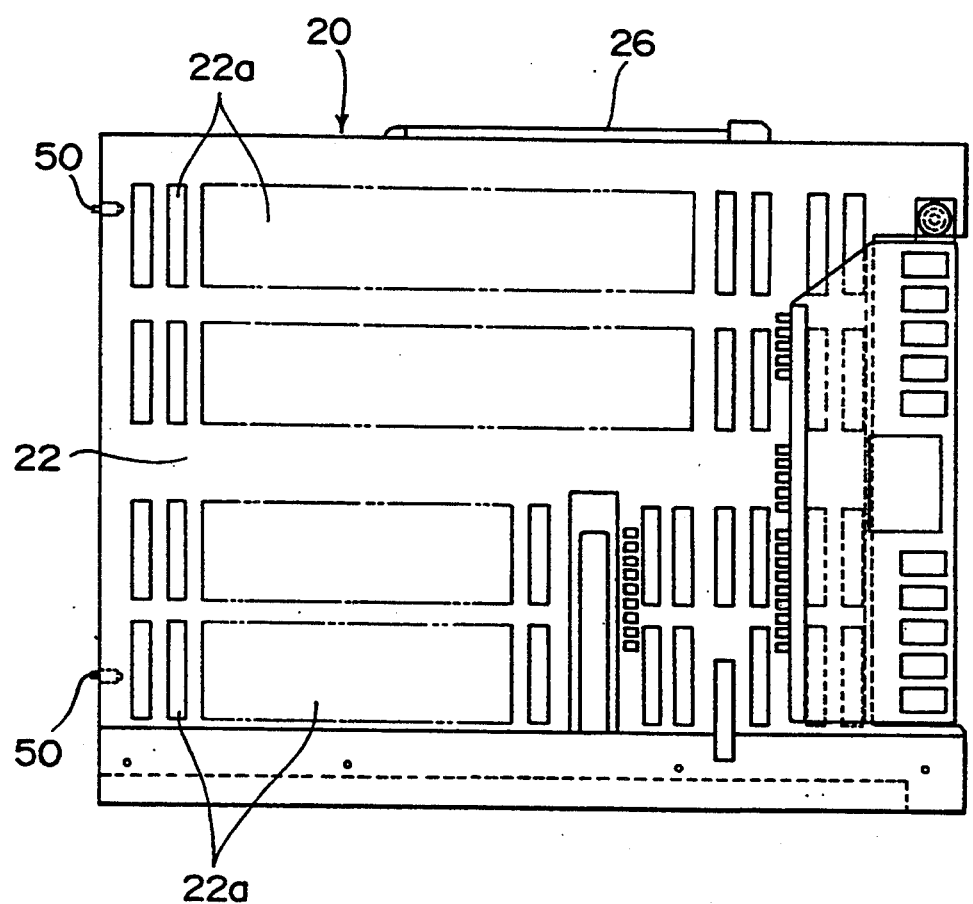
FIG. 6 is a left side view of the cable box.
Figure 7A:
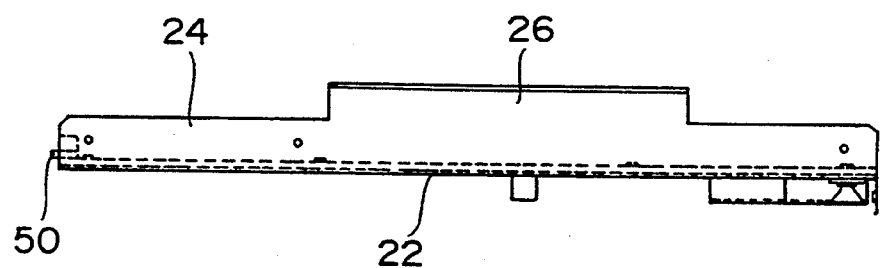
FIG. 7A is a top view of the cable box.
Figure 7B:
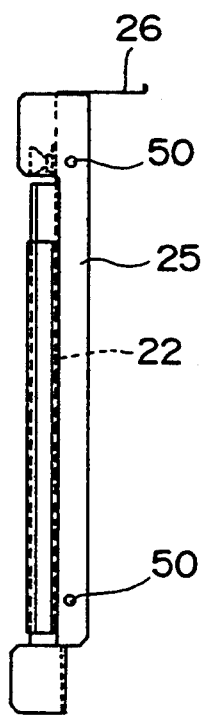
FIG. 7B is a front view of the cable box.

Reference numeral 20 denotes a cable box having a vertical plate 22. The cable box 20 is firmly secured to the upper and lower slide rails 14 and 18. The cable box 20 has a structure as shown in FIGS. 6, and 7B, and a plurality of ventilation holes 22a are formed in the vertical plate 22. Integrally formed with an upper plate 24 bent at right angles with respect to the vertical plate 22 is a retainer portion 26 adapted to retain a drawer unit which will be described later. A pair of pins 50 are fixed to an inner side plate 25 which is bent at right angles with respect to the vertical plate 22.

Figure 8:
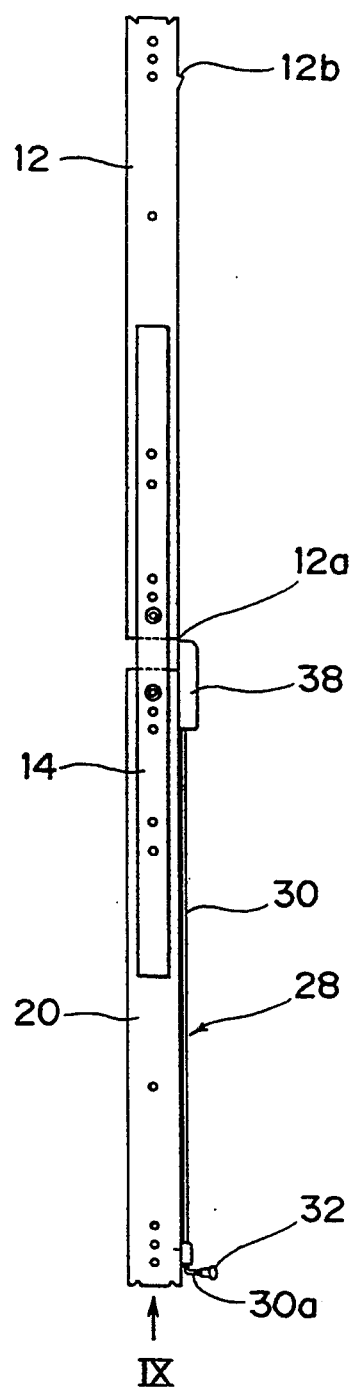
FIG. 8 is a plan view of a lock mechanism for locking the cable box in its fully inserted position and also in its fully withdrawn position.
Figure 9:
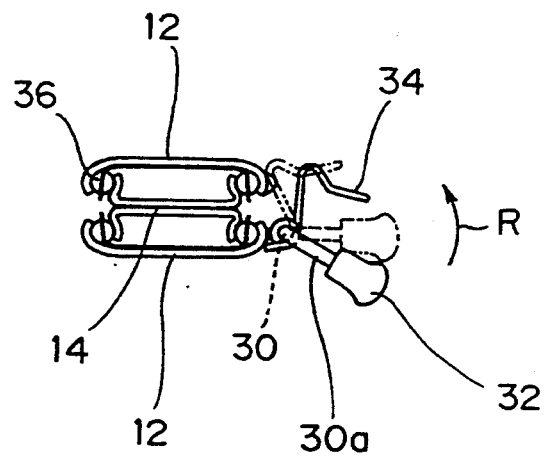
FIG. 9 is a view of the lock mechanism but when viewed in a direction as indicated by an arrow IX of FIG. 8.

Referring now to FIGS. 8 and 9, there will be described a lock mechanism 28 for locking the cable box 20 in its fully inserted position and also in its fully withdrawn position. The lock mechanism 28 comprises a rod 30 slidably mounted on an upper side surface of the cable box 20, and a lock element 38 firmly secured to a distal end of the rod 30.

The rod 30 is provided at this side (i.e., a basal portion) thereof with a bending portion 30a which is bent at approximately 90 degrees. A handle 32 is firmly secured to this bending portion 30a. As shown FIG. 9, the bending portion 30a is biased by a coil spring 34 in a direction as indicated by an arrow R. Disposed between the upper stationary rail 12 and the upper slide rail 14 are a plurality of bearings 36 which are adapted to facilitate a smooth sliding of the slide rail 14.

As shown in FIG. 8, when the cable box 20 is in fully withdrawn position, the lock element 38 firmly secured to the distal end of the rod 30 comes into engagement with a foremost edge 12a of the upper stationary rail 12, thereby preventing the cable box 20 from being pushed toward the shelf 4. Although not particularly shown, a disengagement-preventive mechanism is disposed between the upper slide rail 14 and the upper stationary rail 12 in order to prevent the slide rail 14 from escaping from the stationary rail 12.

The upper stationary rail 12 is provided at one side surface of its inner end portion (upper end in FIG. 8) with a projection 12b, so that when the cable box 20 is in fully inserted position, the lock element 38 firmly secured to the distal end of the rod 30 is in engagement with the projection 12b. As a result, the cable box 20, which would otherwise escape from the shelf 4 due to vibrations, etc., can be prevented from escaping.

For unlocking, the handle 32 is turned clockwise in FIG. 9. By doing this, the lock element 38 is disengaged from the projection 12b to allow the cable box 20 to be withdrawn. When the cable box 20 begins to move toward this side, the handle 32 is touched off. When the cable box 20 has been withdrawn fully, the lock element 38 is brought into engagement with the edge 12a of the upper stationary rail 12, thereby locking the cable box 20 at that location.

Referring again to FIGS. 1 and 2, reference numeral 40 denotes drawer units. Each drawer unit 40 comprises a housing 42, and a plurality of per-line packages 46, each of which stores the contents of service per subscriber, withdrawably inserted in the housing 42. More specifically, a back wiring board 44 is provided to the back of the housing 42, and the per-line packages 46 are inserted respectively along a plurality of guide grooves, not shown, which are formed in the housing 42, and then connectors 46a of the per-line packages 46 are connectively plugged in connectors which are mounted on the back wiring board 44, thereby the drawer unit 40 is constituted.

By employing the per-line package 46 per sub scriber as mentioned above, it becomes possible that when a failure, etc. occur to a certain package 46, only that package 46 can be removed for repair or replacement, so that other lines or circuits may not be adversely affected.

An engagement member 48 is firmly secured to an upper portion of each housing 42. By causing this engagement member 48 to engage the retainer portion 26, the drawer unit 40 is hung on the cable box 20 as shown in FIG. 1. After the drawer unit 40 has been hung on the cable box 20, the pins 50 of the cable box 20 are inserted into unshown holes of the drawer unit housing 42 and then a screw 52, which is provided to a front surface of the housing 42, is threadedly engaged with the cable box 20. As a result, the drawer unit 40 is mounted on the cable box 20 in a stable manner.

In this embodiment, since the upper stationary rails 12 are firmly secured to the upper cross beams 8 in their horizontal postures, force which is generated at the time when the per-line packages 46 are inserted is coped with the upper stationary rails 12. Moreover, since the lower stationary rails 16 are firmly secured to the lower cross beams 10 with their guide surfaces held perpendicular to the lower cross beams 10 respectively, the weight of the drawer units 40 is mostly supported by the lower stationary rails 16.

Figure 4:
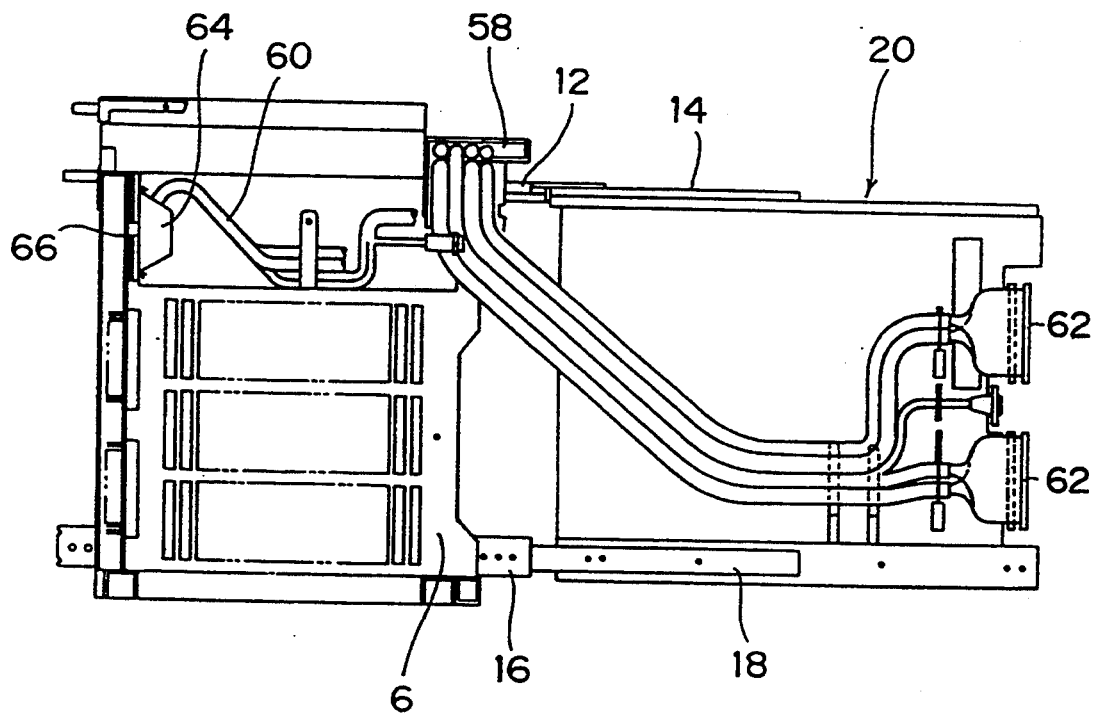
FIG. 4 is a left side view of the embodiment of the present invention in which a cable box is in fully withdrawn position.

A pair of common units 56, which are to be interfaced with unshown external devices, are withdrawably inserted into opposite sides of the shelf 4, respectively. A duct 58 is mounted on a front end upper portion of the shelf 4 and allows a plurality of cables 60 to pass therethrough. As shown in FIG. 4, one end of each cable 60 is connected to a back wiring board 66 of the common unit 56 through a connector 64, and the other end, which extends so far as to the front end of the vertical plate 22 of the cable box 20 along one side surface of the vertical plate 22, is removably connected to the back wiring board 44 of the drawer unit 40 through a connector 62.

Figure 3A:
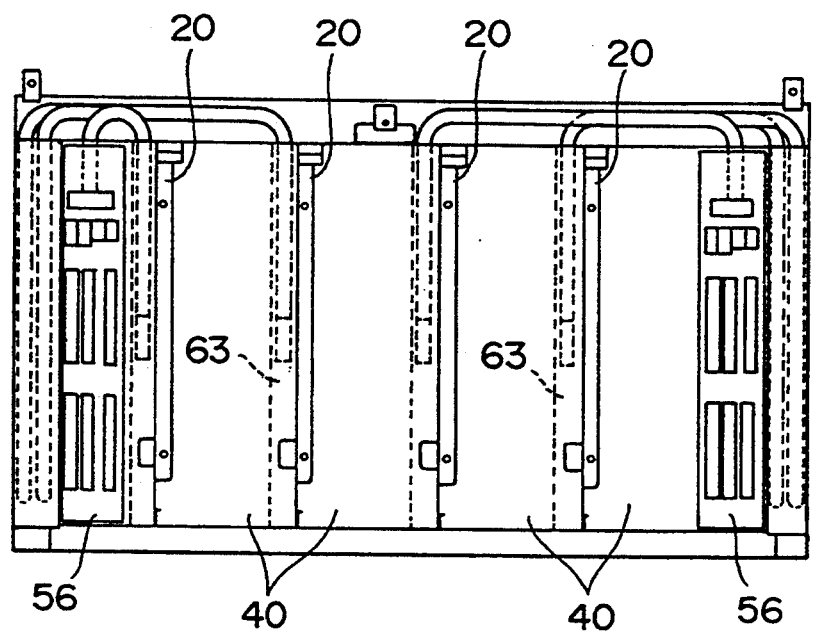
FIG. 3A is a schematic front view of the embodiment of the present invention.
Figure 3B:
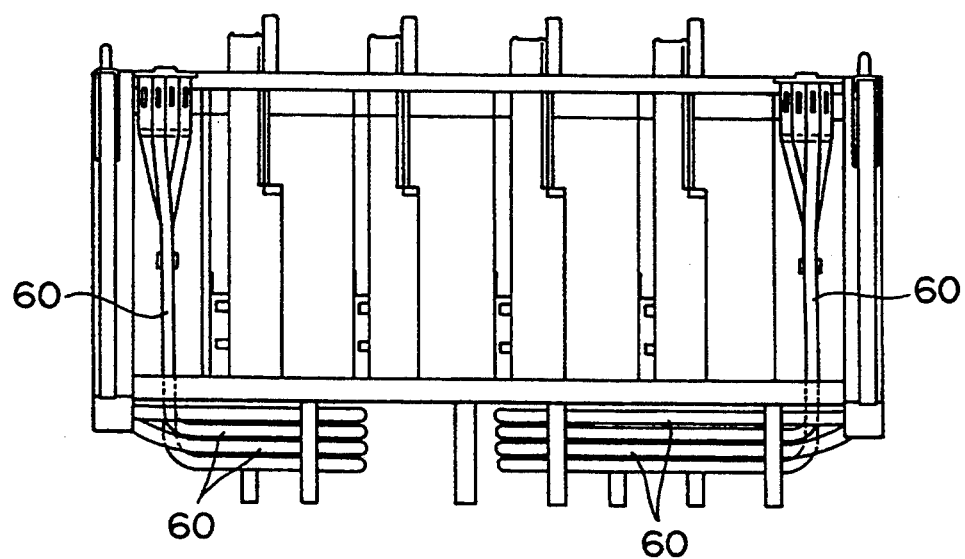
FIG. 3B is a schematic top view of the embodiment of the present invention.

FIG. 3A shows a schematic front view of the embodiment of the present invention, and FIG. 3B shows a schematic top view thereof, in which the extending condition (or wiring condition) of the cables according to the present invention is clearly illustrated. As shown in FIG. 3A, an air pool 63, through which the cables 60 pass, is defined between each cable box 20 and its adjacent drawer unit 40. By virtue of the foregoing arrangement, the cooling effect of the whole shelf assembly 2 can be enhanced.

Furthermore, since the cables 60 do not project from the back of the shelf 4, a sufficient ventilation area can be obtained on the back side of the shelf 4 when the shelf assemblies 2 are placed in back-to-back relation and therefore, the cooling efficiency of the shelf assemblies 2 can be enhanced.

Figure 5:
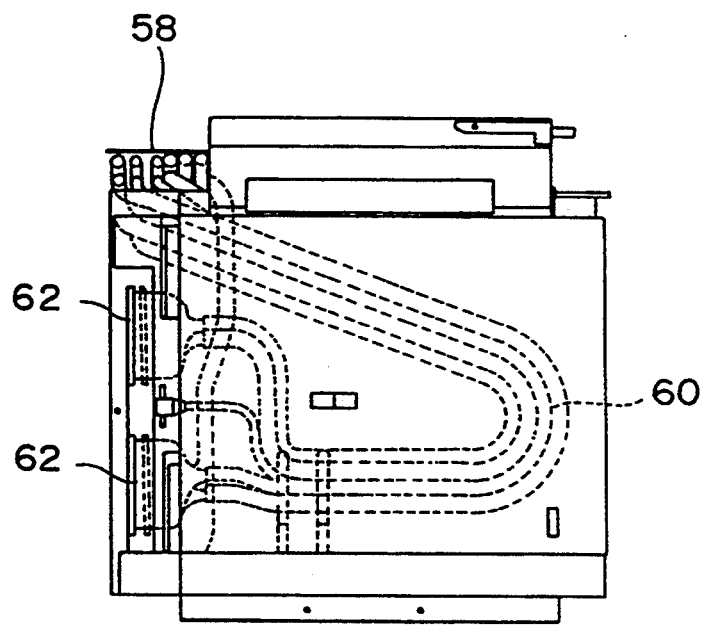
FIG. 5 is a right side view of the embodiment of the present invention but in which the cable box is in fully inserted position.

Referring to FIG. 4, there is shown a left side view of the embodiment in which the cable box 20 is in fully withdrawn position. FIG. 5 shows a right side view of the embodiment in which the cable box 20 is in fully inserted position. In FIG. 5, the side plate 6 of the shelf is omitted. Since the cables 60 lie on the side surface of the cable box 20, there does not occur a swelling of the cables caused by twisting or the like of the cables at the time when the drawer unit is inserted as often experienced in the prior art, and therefore the insertion of the drawer unit is not interrupted by the swelling of the cables. Moreover, as shown in FIG. 5, the cables 60 can be stored in the shelf 4 in an orderly manner by utilizing the principle that an extra length portion of each cable is bent at the time when the cables 60 are stored.

Figure 10:
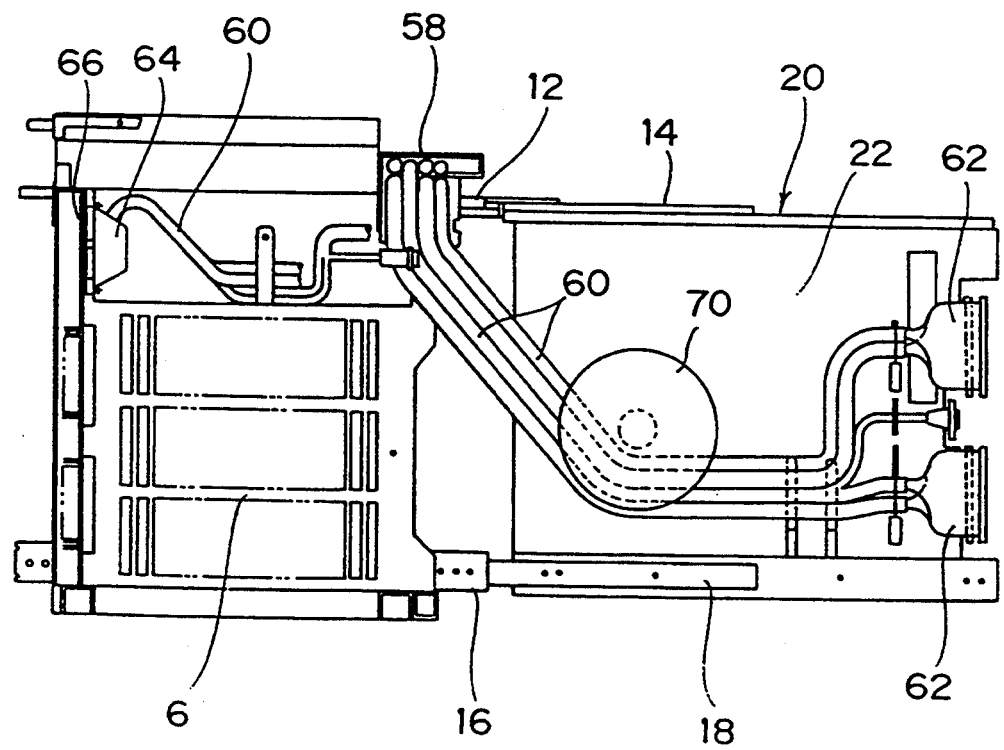
FIG. 10 is a left side view of another embodiment of the present invention in which a cable box is in fully withdrawn position.
Figure 11:
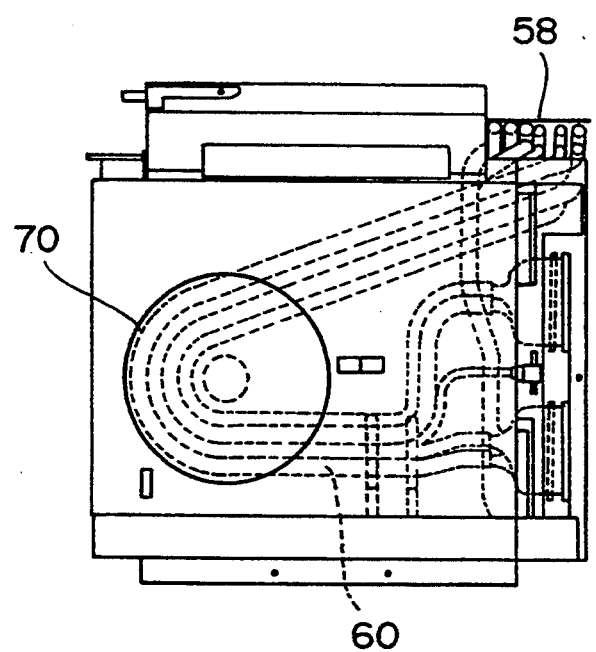
FIG. 11 is likewise a left side view of the above another embodiment but in which the cable box is in fully inserted position.

Referring now to FIGS. 10 and 11, there are shown a left side view of another embodiment of the present invention in which the cable box 20 is in fully withdrawn position and another left side view thereof in which the cable box 20 is in fully inserted position. In FIG. 11, the side plate 6 of the shelf is omitted.

In this embodiment, a disk-shaped guide member 70 is mounted on the cable box 20 in such a manner as to be spaced apart by a predetermined distance from the vertical plate 22 of the cable box 20. In the embodiment shown in FIGS. 4 and 5, although the cables 60 are somewhat swollen at an early insertion process, the cables 60 can be prevented from swelling outwardly in this embodiment owing to the provision of the disk-shaped guide member 70. As a result, the cables can be stored in the shelf 4 smoothly.

As described in detail in the foregoing, according to the present invention, the cable storing area is provided between the adjacent drawer units. Accordingly, cooling capacity of the shelf assembly can be enhanced, and storability of the cables can be enhanced remarkably, too. Moreover, formability of the cables can be enhanced at assembling factories, and replacement workability of the cables as well as maintenance can be enhanced remarkably.

What is claimed is:

1. A shelf assembly in an electronic switching system, comprising:
    a shelf including a pair of side walls, an upper member for connecting said side walls together, and a lower member likewise connecting said side walls together;
    an upper stationary rail firmly secured to said upper member;
    an upper slide rail slidably mounted on said upper stationary rail;
    a lower stationary rail firmly secured to said lower member;
    a lower slide rail slidably mounted on said lower stationary rail;
    a cable box firmly secured to said upper and lower slide rails, said cable box having a plate spreading vertically and defining an area for receiving a cable on one side surface of said vertical plate;
    a drawer unit removably inserted in said cable box along the other side surface of said vertical plate, said drawer unit having a plurality of per-line packages which are withdrawably inserted in said drawer unit and which each stores the contents of service per subscriber;
    a common unit withdrawably inserted in said shelf;
    a cable for electrically connecting said common unit to said drawer unit, said cable extending so far as to a front end of said vertical plate of said cable box along said one side surface of said vertical plate; and
    a connector for connecting one end of said cable to a front end portion of said drawer unit.

2. A shelf assembly in an electronic switching system as claimed in claim 1, further comprising a duct which is mounted on a front end upper portion of said shelf, said duct allowing said cable to pass therethrough.

3. A shelf assembly in an electronic switching system as claimed in claim 2, further comprising lock means for locking said upper slide rail relative to said upper stationary rail when said upper slide rail is in a fully pushed-in position and also in a fully pulled-out position.

4. A shelf assembly in an electronic switching system as claimed in claim 3, further comprising a cable guide member which is mounted on said one side surface of said vertical plate.

5. A shelf assembly in an electronic switching system, comprising:

a shelf including a pair of side walls, at least a pair of upper cross beams for connecting said side walls together, and at least a pair of lower cross beams likewise connecting said side walls together;

a plurality of upper stationary rails firmly secured to and between said upper cross beams in such a manner as to be spaced away from each other;

a plurality of upper slide rails slidably mounted on said upper stationary rails respectively;

a plurality of lower stationary rails firmly secured to and between said lower cross beams in such a manner as to be spaced away from each other;

a plurality of lower slide rails slidably mounted on said lower stationary rails respectively;

a plurality of cable boxes respectively mounted on said upper slide rails and also on said lower slide rails, said cable boxes each having a plate spreading vertically and defining an area for receiving a cable on one side surface of said vertical plate;

a plurality of drawer units each removably inserted in each of said cable boxes along the other side surface of said vertical plate, each of said drawer units having a plurality of per-line packages which are withdrawably inserted in each of said drawer units, said per-line packages each storing the contents of service per subscriber;

a common unit withdrawably inserted in said shelf;

a plurality of cables for electrically connecting said common unit to said drawer units, said cables each extending so far as to a front end of said vertical plate of each of said cable boxes along said one side surface of said vertical plate; and a plurality of connectors for connecting one ends of said cables to front end portions of said drawer units respectively.

* * * * *

UNITED STATES PATENT AND TRADEMARK OFFICE
CERTIFICATE OF CORRECTION

PATENT NO. : 5,381,315

DATED : January 10, 1995

INVENTOR(S) : Akihiro Hamaguchi et al.

It is certified that error appears in the above-identified patent and that said Letters Patent is hereby corrected as shown below:

Col. 1, line 6, delete "1."; and line 10, delete "2.".

Col. 4, line 9, after "FIGS. 6," insert --7A--.

Signed and Sealed this

Twenty-eight Day of March, 1995

Attest:

BRUCE LEHMAN

Attesting Officer   Commissioner of Patents and Trademarks